United States Patent
Saeedi Vahdat et al.

(10) Patent No.: US 11,987,879 B2
(45) Date of Patent: May 21, 2024

(54) HIGH ASPECT RATIO TAPER IMPROVEMENT USING DIRECTIONAL DEPOSITION

(71) Applicant: Applied Materials, Inc., Santa Clara, CA (US)

(72) Inventors: Armin Saeedi Vahdat, Burlington, MA (US); Yan Zhang, Westford, MA (US); John Hautala, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 17/673,667

(22) Filed: Feb. 16, 2022

(65) Prior Publication Data
US 2023/0257872 A1 Aug. 17, 2023

(51) Int. Cl.
| | |
|---|---|
| *H01L 21/306* | (2006.01) |
| *C23C 14/48* | (2006.01) |
| *C23C 16/30* | (2006.01) |
| *C23C 16/40* | (2006.01) |
| *C23C 16/513* | (2006.01) |
| *C23C 28/04* | (2006.01) |
| *H01L 21/3065* | (2006.01) |

(52) U.S. Cl.
CPC ............ *C23C 16/303* (2013.01); *C23C 14/48* (2013.01); *C23C 16/40* (2013.01); *C23C 16/513* (2013.01); *C23C 28/04* (2013.01); *H01L 21/30604* (2013.01); *H01L 21/30621* (2013.01); *H01L 21/3065* (2013.01)

(58) Field of Classification Search
None
See application file for complete search history.

(56) References Cited

U.S. PATENT DOCUMENTS

| | | | | |
|---|---|---|---|---|
| 11,119,405 | B2 * | 9/2021 | Evans | H01J 37/32422 |
| 11,152,373 | B1 * | 10/2021 | Varghese | H10B 12/34 |
| 2008/0237698 | A1 * | 10/2008 | Mokhlesi | H10B 43/30 |
| | | | | 257/326 |

(Continued)

FOREIGN PATENT DOCUMENTS

WO   WO-2018118085 A1 *   6/2018   ......... H01L 21/0337

OTHER PUBLICATIONS

Oh et al., Microelectronics Journal vol. 79, Sep. 2018, pp. 1-6, "Impact of etch angles on cell characteristics in 3D NAND flash memory", https://doi.org/10.1016/j.mejo.2018.06.009, 6 pages.

*Primary Examiner* — Shamim Ahmed
(74) *Attorney, Agent, or Firm* — KDW Firm PLLC

(57) ABSTRACT

Disclosed are approaches for forming semiconductor device cavities. One method may include providing a set of semiconductor structures defining an opening, wherein the opening has a first opening width along an upper portion of the opening and a second opening width along a lower portion of the opening, the first opening width being greater than the second opening width. The method may further include forming a blocking layer along the set of semiconductor structures by delivering a material at a non-zero angle of inclination relative to a normal extending perpendicular from a top surface of the set of semiconductor structures. The blocking layer may be formed along the upper portion of the opening without being formed along the lower portion of the opening, and wherein an opening through the blocking layer is present above the opening.

20 Claims, 6 Drawing Sheets

(56) References Cited

U.S. PATENT DOCUMENTS

| | | | |
|---|---|---|---|
| 2015/0243674 A1* | 8/2015 | Shih | H01L 21/32133 |
| | | | 438/268 |
| 2021/0159409 A1* | 5/2021 | Miao | H10B 63/845 |
| 2021/0242032 A1* | 8/2021 | Colinjivadi | H01L 21/31116 |
| 2022/0285130 A1* | 9/2022 | Dole | H01J 37/32165 |
| 2022/0399225 A1* | 12/2022 | Saeedi Vahdat | H01L 21/764 |

* cited by examiner

HIGH ASPECT RATIO TAPER IMPROVEMENT USING DIRECTIONAL DEPOSITION

FIELD

Embodiments of the present disclosure generally relate to substrate processing equipment and techniques, and more particularly, to approaches for forming semiconductor device cavities using directional deposition to reduce high aspect ratio tapering.

BACKGROUND

As semiconductor technology advances, the market demands increasing smaller chips with increasingly more structures per unit area. One class of devices which has seen many advances in miniaturization are memory devices. The typical approach for 3D NAND devices has been to stack more layers. Yet additional layers result in thicker stacks, which are increasingly difficult to etch due to increasing aspect ratios. For example, higher aspect ratios generally lead to increased profile taper, which increases cell VT variation significantly. As the device scales, this issue risks becoming worse.

It is with respect to these and other considerations that the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In some approaches, a method may include providing a set of semiconductor structures defining an opening, wherein the opening has a first opening width along an upper portion of the opening and a second opening width along a lower portion of the opening, and wherein the first opening width is greater than the second opening width. The method may further include forming a blocking layer along the set of semiconductor structures by delivering a material at a non-zero angle of inclination relative to a normal extending perpendicular from a top surface of the set of semiconductor structures, and delivering the material at a second non-zero angle of inclination relative to the normal extending perpendicular from the top surface of the set of semiconductor structures, wherein the blocking layer is formed along the upper portion of the opening without being formed along the lower portion of the opening, and wherein an opening through the blocking layer is present above the opening.

In some approaches, a method of forming a memory hole in a semiconductor device may include providing a set of semiconductor structures defining a memory hole, wherein the memory hole has a first opening width along an upper portion of the memory hole and a second opening width along a lower portion of the memory hole, and wherein the first opening width is greater than the second opening width. The method may further include forming a blocking layer along the set of semiconductor structures by delivering a material at a non-zero angle of inclination relative to a normal extending perpendicular from a top surface of the set of semiconductor structures, and by delivering the material at a second non-zero angle of inclination relative to the normal extending perpendicular from the top surface of the set of semiconductor structures, wherein the blocking layer is formed along the upper portion of the memory hole without being formed along the lower portion of the memory hole, and wherein an opening through the blocking layer is present above the memory hole. The method may further include etching the lower portion of the memory hole following formation of the blocking layer, wherein etching the lower portion of the opening increase the second opening width.

In some approaches, a memory device may include providing a pair of semiconductor structures each having a sidewall defining a via, wherein the via has a first opening width along an upper portion of the sidewalls and a second opening width along a lower portion of the sidewalls, and wherein the first opening width is greater than the second opening width. The method may further include forming a blocking layer along the upper portion of the sidewalls of the pair of semiconductor structures by delivering a material at a first non-zero angle of inclination relative to a normal extending perpendicular from a top surface of the pair of semiconductor structures, and by delivering the material at a second non-zero angle of inclination relative to the normal extending perpendicular from the top surface of the pair of semiconductor structures, wherein the blocking layer is prevented from being formed along the lower portion of the sidewalls of the pair of semiconductor structures, and wherein an opening through the blocking layer is present above the via. The method may further include etching, following formation of the blocking layer, the lower portion of the sidewalls of the pair of semiconductor structures to increase the second opening width.

BRIEF DESCRIPTION OF THE DRAWINGS

By way of example, embodiments of the disclosure will now be described, with reference to the accompanying drawings, in which.

Figure 1:
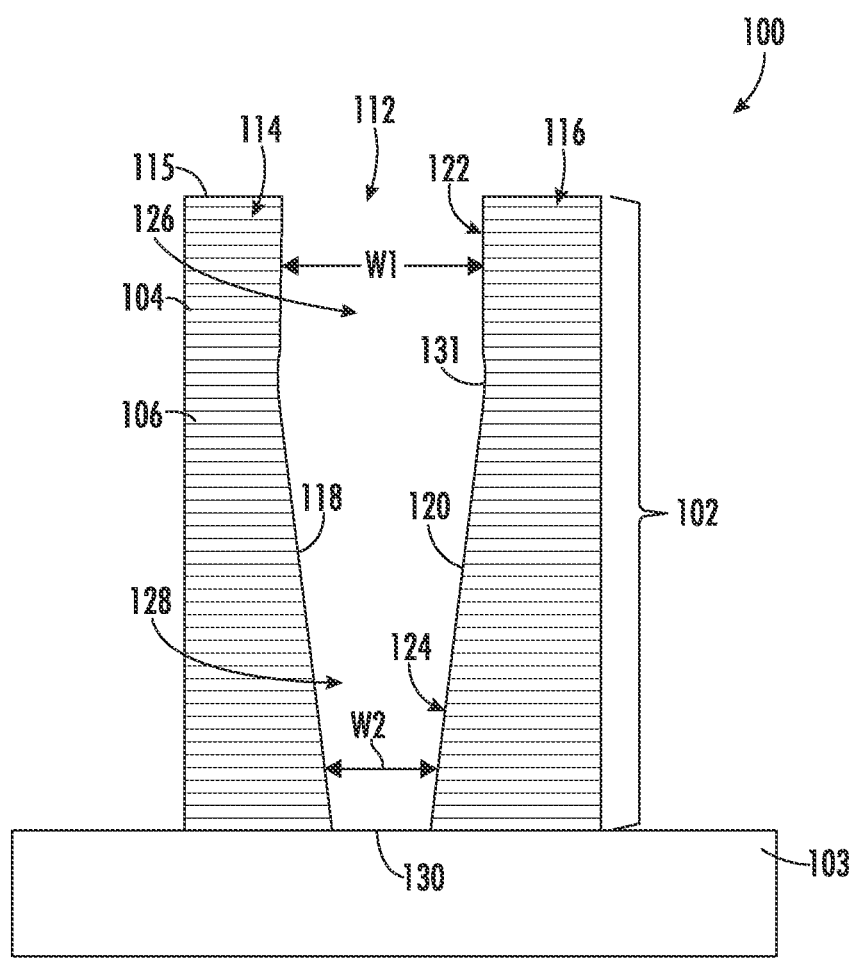
FIG. 1 depicts a side cross-sectional view of an exemplary device structure including an opening, in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, structures, and systems in accordance with the present disclosure will now be described more fully hereinafter with reference to the accompanying drawings, where embodiments are shown. The methods, devices, structures, and systems may be embodied in many different forms and are not to be construed as being limited to the embodiments set forth herein. Instead, these embodiments are provided so the disclosure will be thorough and complete, and will fully convey the scope of the methods, devices, structures, and systems to those skilled in the art.

Embodiments described herein generally relate to improved techniques for forming openings (e.g., vias or memory holes) in memory devices, such as DRAM or 3D NAND. Some embodiments of the disclosure advantageously provide methods for forming 3D NAND devices with more uniform memory hole CD by depositing a blocking layer (e.g., carbon) over just an upper portion of the memory hole prior to an etch process. Taper reduction is therefore obtained by enlarging the lower portion of memory hole with minimal or no impact to the upper portion of the memory hole.

FIG. 1 demonstrates a semiconductor device or structure 100, such as a 3D NAND structure, according to embodiments of the disclosure. In other embodiments, the structure 100 may be a logic device, DRAM, or other type of semiconductor device. As shown, the structure 100 may include a stack of layers 102 formed over a substrate 103. In some embodiments, the stack of layers may include alternating layers of nitride 104 and oxide 106 deposited on the substrate 103. In some embodiments, the alternating layers may be separated by a silicon layer. In some embodiments, the nitride 104 comprises silicon nitride. In some embodiments, the oxide 106 comprises silicon oxide. In some embodiments, the silicon layer consists essentially of silicon. As will be understood by one skilled in the art, each of the nitride 104 and the oxide 106 may be stoichiometric or non-stoichiometric materials.

The alternating layers of nitride 104 and oxide 106 may be deposited by any suitable process. In some embodiments, each of the layers of nitride 104 and oxide are deposited by chemical vapor deposition. The individual alternating layers may be formed to any suitable thickness. In some embodiments, the thickness of each layer of nitride 104 is approximately equal. In some embodiments, the thickness of each layer of oxide 106 is approximately equal. As used in this regard, thicknesses which are approximately equal are within +/−5% of each other. In some embodiments, the average thickness of the layers of nitride 104 is approximately equal to the average thickness of the layers of oxide 106. In other embodiments, a single layer of material may be present instead of a plurality of different, alternating layers.

As further shown, the structure 100 may include a set of semiconductor structures (hereinafter "structures") 114, 116 together defining an opening 112, which may be a cylindrical via or memory hole. Although only a single opening 112 is depicted, it will be appreciated that the structure 100 may include many additional structures 114, 116 and openings 112. In some embodiments, the opening 112 may be formed (e.g., dry etched) through the stack of layers 102 to form the structures 114, 116. As shown, the structures 114, 116 may include a top surface 115 and respective sidewalls 118, 120 on opposite sides of the opening 112. The sidewalls 118, 120 may each include an upper portion 122 and a lower portion 124. Similarly, the opening 112 may include an upper portion 126, a lower portion 128, and a base surface 130. In some embodiments, a first opening width 'W1' of the opening 112 along the upper portion 126 may be smaller than a second opening width 'W2' along the lower portion 128. Although non-limiting, the opening 112 may also have a bowed portion 131, which represents a widest distance between the sidewalls 118, 120. The sidewalls 118, 120 may generally taper or angle towards one another from the bowed portion 131 to the base surface 130 of the opening 112.

Any suitable etching apparatus and/or method may be employed to form the opening 112, such as deep reactive-ion etching (DRIE), a highly anisotropic etch process employed to create high aspect-ratio holes and openings in wafers or other substrates. Etching gases suitable for such etching processes can include fluoride ($SF_6$, $CF_4$, $CHF_3$, $CH_3F$, $C_2F_6$, $C_4F_8$, and $NF_3$), chloride (HCl, $Cl_2$, $BCl_3$), bromide ($Br_2$, HBr), or, an oxygen containing gas (e.g., $O_3$, $O_2$, $CO_2$, CO, $H_2O$, NO, $NO_2$, $N_2O$, CO, and the like) and optionally may include an inert gas, such as argon (Ar) or helium (He). Embodiments are not limited in this context.

Figure 2:
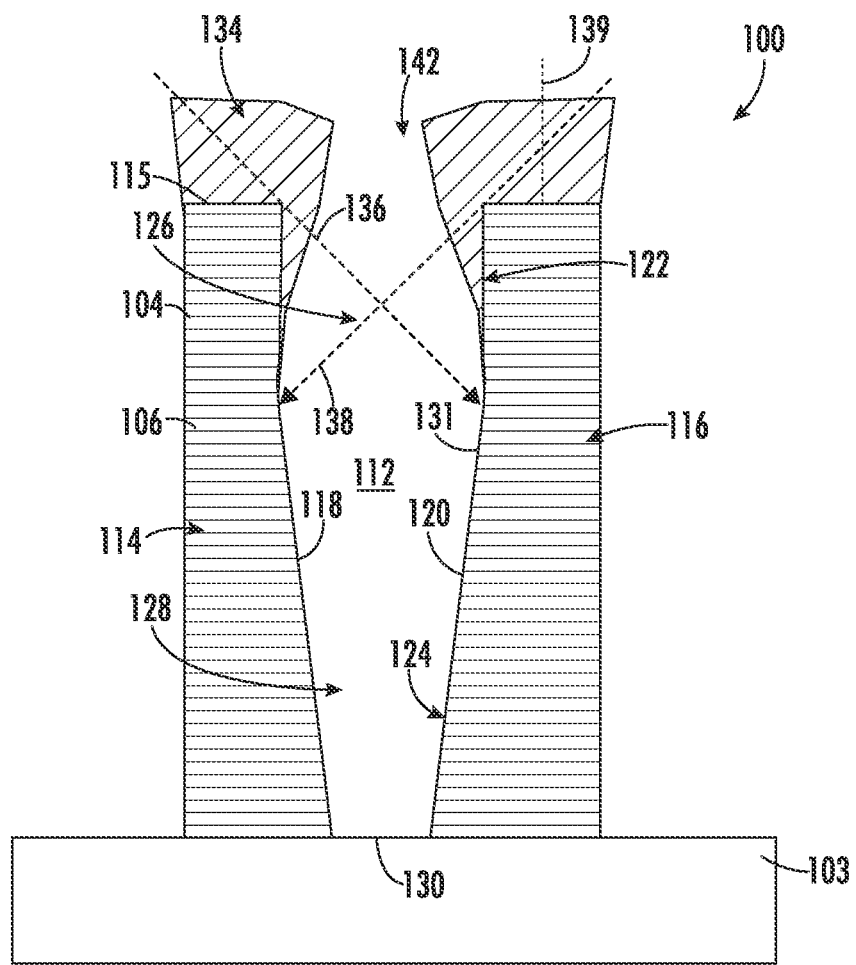
FIG. 2 depicts a side cross-sectional view of the device structure following formation of a blocking layer, in accordance with embodiments of the present disclosure.

As shown in FIG. 2, a blocking layer 134 (e.g., carbon) may be formed over the structures 114, 116, including along the top surface 115 and the upper portion 122 thereof. In some embodiments, a first deposition process 136 may be performed to form a material along structure 116, and a second deposition process 138 may be performed to form the material along structure 114. The first deposition process 136 may include delivering radicals to structure 116 at a first non-zero angle of inclination relative to a vertical 139 extending from the top surface 115 of the structures 114, 116. In various embodiments, the first deposition process 136 may include delivering one or more of the following species to the structures 114, 116: a-Si, SiO2, SiN, SiC, SiCN, a boron and carbon (B, C) film, or a tungsten and carbon (W, C) film. Similarly, the second deposition process 138 may include delivering radicals to vertical structure 114 at a second non-zero angle of inclination relative to the vertical 139 extending from the top surface 115 of the vertical structures 114, 116. In various embodiments, the second deposition process 138 may include delivering one or more of the following species to the structures 114, 116: He, Ne, Kr, Xe, H, Si, or F. Due to the first and second non-zero angles of inclination, in combination with the aspect ratio of the opening 112, the material is formed just along the upper portion 122 of the sidewalls 118, 120. In some embodiments, the first and second non-zero angles of inclination are selected to ensure the blocking layer 134 reaches and/or covers the bowed portion 131 of the sidewalls 118, 120 without covering the lower portion 124. As further shown, the blocking layer 134 is not present along the base surface 130. Once the blocking layer 134 is formed, an opening or gap 142 in the blocking layer 134 may remain present over the opening 112.

In various embodiments, the first and second angles of inclination of the first deposition process 136 and the second deposition process 138, respectively, may vary so the blocking layer 134 impacts more or less of the sidewalls 118, 120. In some embodiments, the structure 100 may be rotated between the successive deposits so all intended areas of the opening 112 are impacted.

Figure 3:
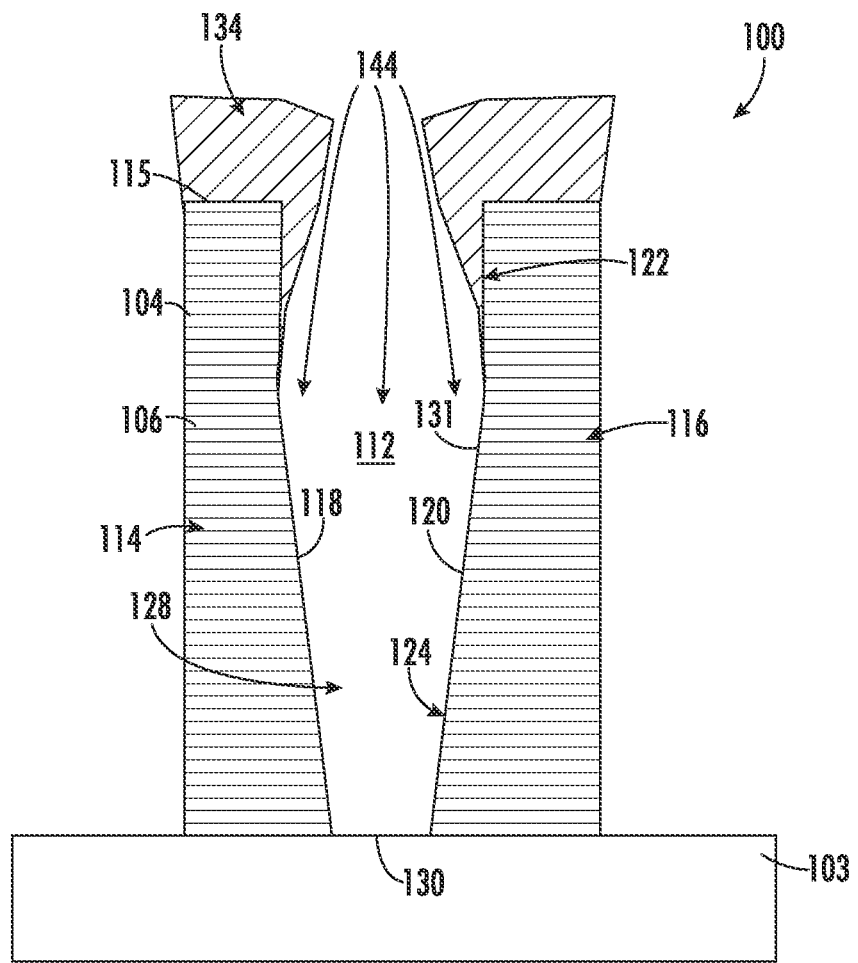
FIG. 3 depicts a side cross-sectional view of the device structure during an optional ion implant, in accordance with embodiments of the present disclosure.

As shown in FIG. 3, an optional ion implant 144 may then be performed on the opening 112 while the blocking layer 134 is present within the upper portion 126 of the opening 112. In some embodiments, the ion implant 144 may include argon ions (e.g., 15 keV 5e15, 0/RT) directed through the gap 142 to treat the exposed sidewalls 118, 120 in the lower portion 128 of the opening 112. Due to the presence of the blocking layer 134, the ion implant 144 does not impact the upper portion 122 of sidewalls 118, 120. The ion implant 144 may modify surface properties of the sidewalls 118, 120 to increase etch rate. It will be appreciated that the parameters of the ion implant 144 including, but not limited to, the selection of ion species, acceleration energy, dose, tilt angle and substrate temperature, to be applied can provide control over the nature of the change in etch rate. For example, the etch rate of implanted regions can be enhanced due to structural damage, e.g., the etch rate of the structures 114, 116 increases with argon ion implant dose above a certain threshold level. The etch rate along the lower portion 124 of the sidewalls 118, 120 also can be enhanced through multiple implant steps. For example, doubly implanted regions may etch at a faster rate. Furthermore, in some embodiments, the implant dose can be decreased or increased by adjusting the implantation time and ion beam current to adjust the etch rate accordingly.

Figure 4:
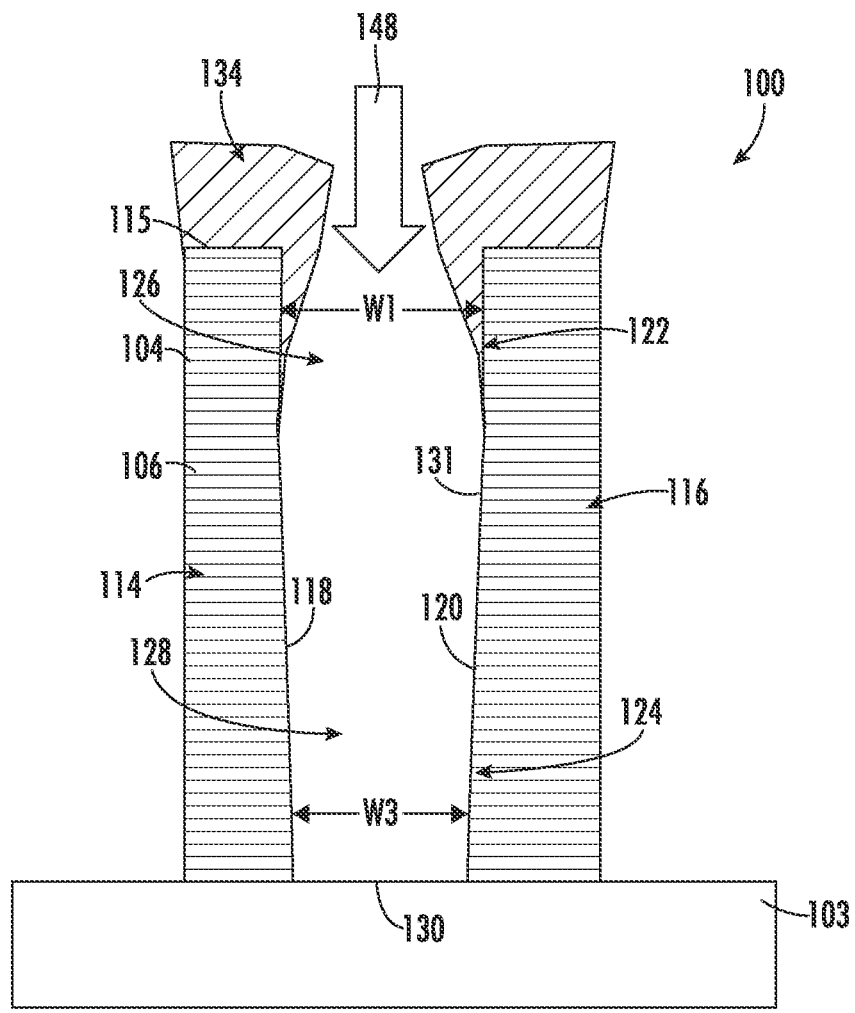
FIG. 4 depicts a side cross-sectional view of the device structure during an etch process, in accordance with embodiments of the present disclosure.
Figure 5:
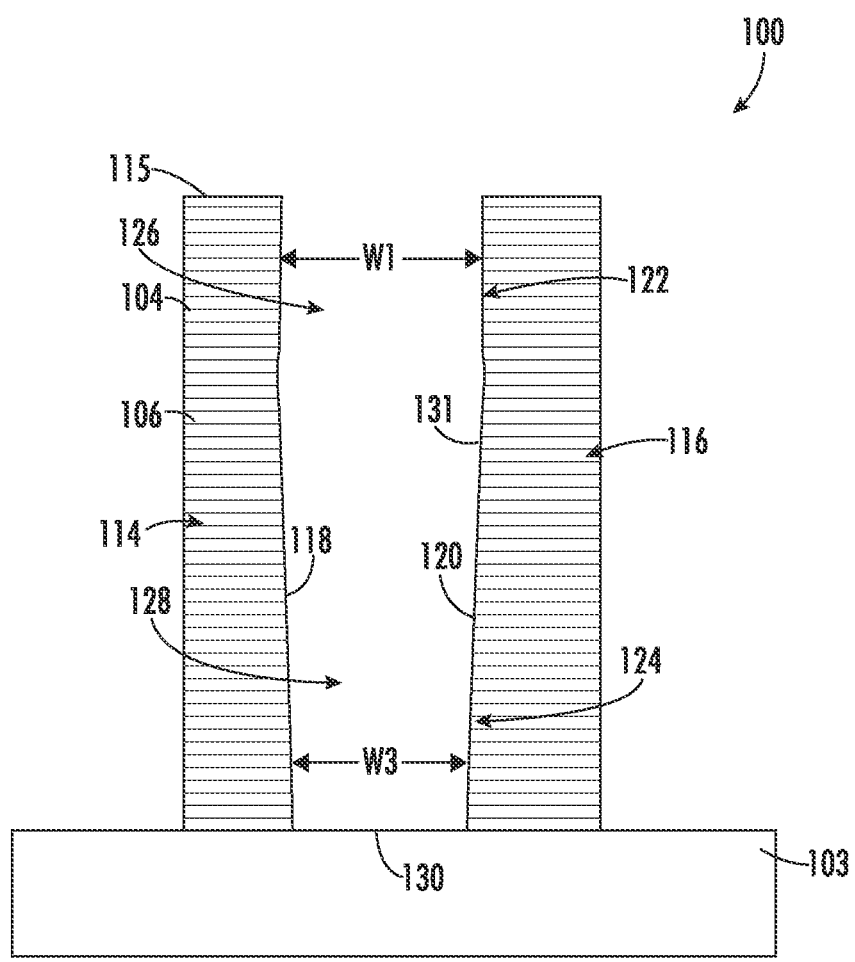
FIG. 5 depicts a side cross-sectional view of the device structure following the etch process, in accordance with embodiments of the present disclosure.

As shown in FIG. 4, the lower portion 124 of the sidewalls 118, 120 within the opening 112 may be etched 148 to increase a width (W3) along the lower portion 128 of the opening 112. In some embodiments, the etch 148 is a wet etch process performed following the ion implant 144. In other embodiments, the etch 148 is a reactive ion etch (RIE). In yet other embodiments, the etch 148 may be performed within the opening 112 after the blocking layer 134 is formed, but without any prior treatment being performed on the sidewalls 118, 120. For example, a high-energy RIE may be performed following the formation of the blocking layer 134 because the blocking layer 134 will shadow the energetic ions from striking the sidewalls 118, 120 of the upper portion 126 of the opening 112 and thus only etch the desired lower portion 124 wider. As shown, the etch 148 may be performed through the gap 142 in the blocking layer 134. Due to the presence of the blocking layer 134, the etch 148 may have no, or minimal, impact on the upper portion 122 of the sidewalls 118, 120 to ensure W1 of the upper portion 126 of the opening 112 remains substantially constant. W3 represents an increase of W2 (FIG. 1). By removing material from the lower portion 124 of sidewall 118 and sidewall 120, an overall width of the opening 112 may be more consistent between the top surface 115 of the structures 114, 116 and the base surface 130. Following the etch 148, the blocking layer 134 may be removed, as demonstrated in FIG. 5.

Figure 6:
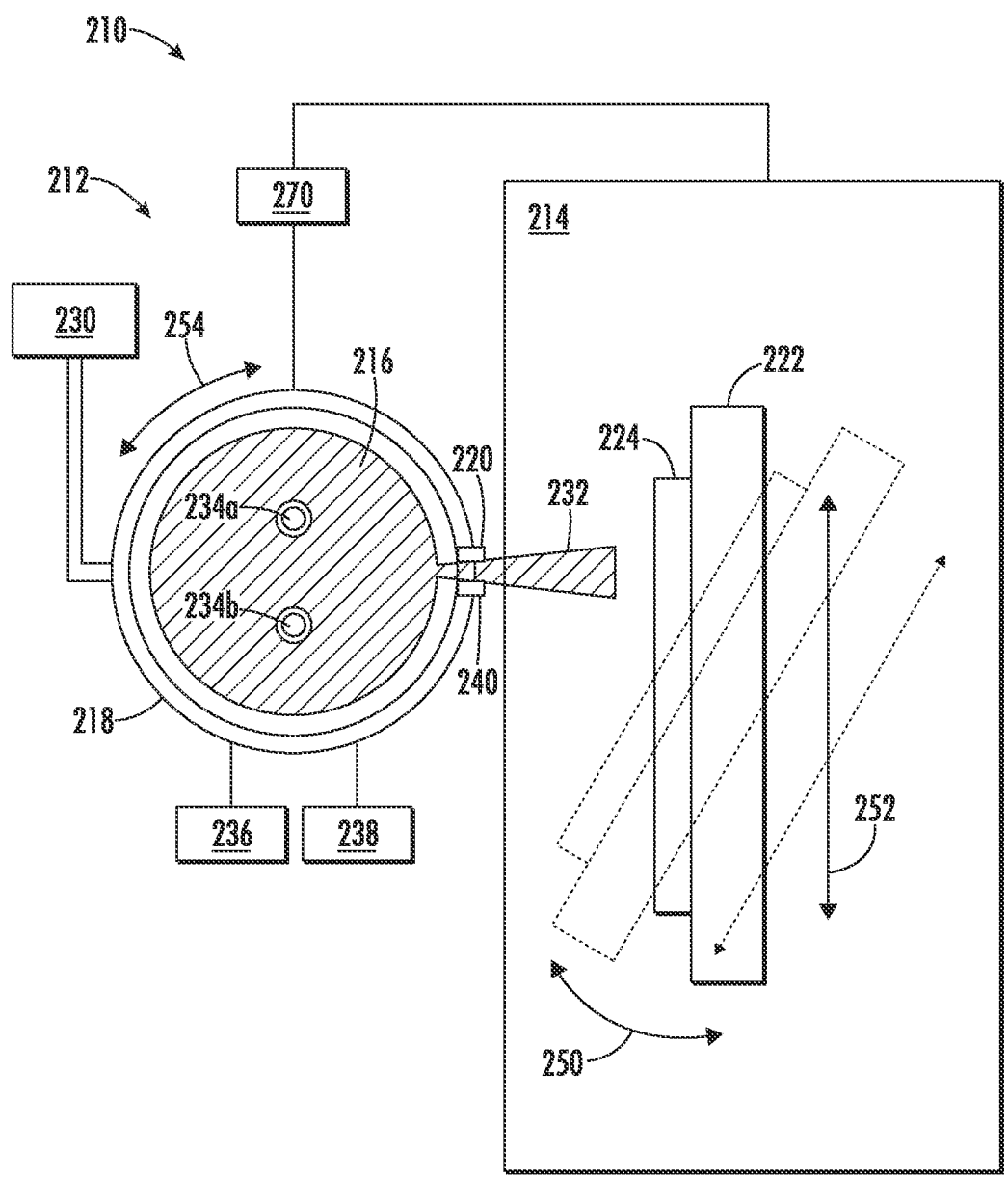
FIG. 6 is a schematic diagram of a system for forming the device structure, in accordance with embodiments of the present disclosure.

FIG. 6 illustrates a portion of a system 210 useful to perform processes described herein, such as the first and second deposition processes 136, 138. The system 210 may generally include a plasma source 212 disposed adjacent a process chamber 214. The plasma source 212 may be adapted to generate an energetic plasma 216 in a plasma chamber 218, and to emit the plasma 216, e.g., through a nozzle 220 of the plasma chamber 218, or alternatively with a second plate with a separate aperture situated a specific distance away from 218. While the plasma chamber 218 is depicted as being generally cylindrical in shape, the present disclosure is not limited in this regard, and the plasma chamber 218 may be implemented in a variety of alterative shapes and configurations.

The process chamber 214 may contain a platen 222 adapted to support a substrate 224 (e.g., a silicon wafer) in a confronting relationship with the nozzle 220 of the plasma chamber 218. In various embodiments, the platen 222 may be adapted to forcibly retain the substrate 224, such as via electrostatic clamping or mechanical clamping. Additionally, the platen 222 may include a heating element (not shown) for controllably heating the substrate 224 to a desired temperature (e.g., a temperature in a range between room temperature and 450 degrees Celsius) to enhance deposition processes.

The plasma source 212 of the system 210 may be configured to generate the plasma 216 from a gaseous species supplied to the plasma chamber 218 by one or more gas sources 230. The gaseous species may include one or more of SiH4, CH4, NH3, O2, N2, SiCl4, GeH4, Ar, WF6, etc. The present disclosure is not limited in this regard. The plasma 216 (and particularly free radicals within the plasma) may be projected through the nozzle 220 in the form of a ribbon beam 232 directed at the substrate 224 as further described below. In various embodiments, the plasma source 212 may be a radio frequency (RF) plasma source (e.g., an inductively-coupled plasma (ICP) source, a capacitively coupled plasma (CCP) source, a helicon source, an electron cyclotron resonance (ECR) source, etc.). For example, the plasma source 212 may include electrodes 234a, 234b, an RF generator 236, and an RF matching network 238 for igniting and sustaining the plasma 216 in a manner familiar to those of ordinary skill in the art. The present disclosure is not limited in this regard.

The plasma 216 generated in the plasma chamber 218 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 218 of the system 210 is separate from the process chamber 214 where the platen 222 and the substrate 224 reside, and a collimated ribbon beam 232 containing free radicals of the plasma 216 is extracted from the plasma chamber 218 and is directed at the substrate 224 in a directionally-specific, anisotropic manner. This is achieved by establishing a pressure differential between the plasma chamber 218 and the process chamber 214, and by collimating the radical beam. In a non-limiting example, the radical beam may be extracted through a nozzle 220 or a second aperture plate having an elongated profile. With regard to the pressure differential, the process chamber 214 may be maintained at a first pressure, and the plasma chamber 218 may be maintained at a second pressure higher than the first pressure. In various examples, the first pressure in the process chamber may be in a range of $10^{-6}$ torr to $10^{-2}$ torr, and the second pressure in the plasma chamber 218 may be in a range of 1 millitorr to 1 torr. The present disclosure is not limited in this regard. Thus, the pressure differential between the plasma chamber 218 and the process chamber 214 may provide a motive force for driving free radicals in the plasma 216 from the plasma chamber 218 into the process chamber 214 in the form of a ribbon beam 232.

The ribbon beam 232 may be given its shape and may be collimated using various structures, devices, and techniques. In one example, the ribbon beam 232 may be given its shape and may be collimated by the elongated, low-profile nozzle 220 of the plasma chamber 218 or alternatively with a second plate set a specific distance away from 218 with a second aperture slot.

The platen 222 may be rotatable and movable for pivoting and scanning the substrate 224 relative to the plasma chamber 218 as indicated by arrows 250 and 252. Additionally or alternatively, the plasma chamber 218 may be rotatable about its long axis as indicated by the arrow 254. Thus, the collimated, free radical-containing ribbon beam 232 may be projected onto the substrate 224 at various oblique angles in a highly directional, anisotropic manner to deposit films on specific sides and/or portions of surface features (e.g., openings, fins, etc.) of the substrate 224 while keeping other sides and/or portions of such surface features free of such depositions. In a non-limiting example, the movement and/or rotation of the platen 222 and/or the plasma chamber 218 may facilitate projecting the ribbon beam 232 onto the substrate 224 at angles in a range of 30 degrees to 80 degrees relative to a surface of the platen 222 with angle spreads in a range of +/−5 degrees to +/−30 degrees.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing a set of semiconductor structures defining an opening, wherein the opening has a first opening width along an upper portion of the opening and a second opening width along a lower portion of the opening, and wherein the first opening width is greater than the second opening width; and
    forming a blocking layer along the set of semiconductor structures by delivering a material at a non-zero angle of inclination relative to a normal extending perpendicular from a top surface of the set of semiconductor structures, wherein the blocking layer is formed along the upper portion of the opening without being formed along the lower portion of the opening, and wherein an opening through the blocking layer is present above the opening.

2. The method of claim 1, further comprising etching the lower portion of the opening following formation of the blocking layer to increase the second opening width.

3. The method of claim 2, wherein etching the lower portion of the opening comprises performing a wet etch process or a reactive ion etch process through the opening of the blocking layer.

4. The method of claim 2, further comprising performing an ion implant to the opening while the blocking layer is present along the upper portion of the opening.

5. The method of claim 4, wherein the lower portion of the opening is etched following the ion implant.

6. The method of claim 4, wherein the performing the ion implant comprises directing at least one of the following ion species into the lower portion of the opening: argon, helium, neon, krypton, xenon, hydrogen, silicon, or fluorine.

7. The method of claim 1, wherein delivering the material at the non-zero angle of inclination comprises depositing at least one of the following along the top surface of the set of semiconductor structures and along the upper portion of the opening: carbon, amorphous silicon, silicon dioxide, silicon nitride, silicon carbide, silicon carbonitride, a boron-carbon film, or a tungsten-carbon film.

8. The method of claim 1, wherein providing the set of semiconductor structures defining the opening comprises:
    forming a stack of alternating first and second layers; and
    etching the stack of alternating first and second layers to form the opening.

9. A method of forming a memory hole in a semiconductor device, the method comprising:
    providing a set of semiconductor structures defining the memory hole, wherein the memory hole has a first opening width along an upper portion of the opening and a second opening width along a lower portion of the opening, and wherein the first opening width is greater than the second opening width;
    forming a blocking layer along the set of semiconductor structures by:

delivering a material at a first non-zero angle of inclination relative to a normal extending perpendicular from a top surface of the set of semiconductor structures; and delivering the material at a second non-zero angle of inclination relative to the normal extending perpendicular from the top surface of the set of semiconductor structures, wherein the blocking layer is formed along the upper portion of the memory hole without being formed along the lower portion of the memory hole, and wherein an opening through the blocking layer is present above the memory hole; and etching the lower portion of the memory hole following formation of the blocking layer, wherein etching the lower portion of the opening increase the second opening width.

10. The method of claim 9, wherein etching the lower portion of the memory hole comprises performing a wet etch process while the blocking layer is present along the upper portion of the memory hole.

11. The method of claim 9, further comprising performing an ion implant to the memory hole while the blocking layer is present along the upper portion of the memory hole, wherein the lower portion of the memory hole is etched following the ion implant.

12. The method of claim 11, wherein the performing the ion implant comprises directing argon ions into the lower portion of the memory hole.

13. The method of claim 9, wherein delivering the material at the first and second non-zero angles comprises depositing carbon along the top surface of the set of semiconductor structures and along the upper portion of the memory hole.

14. The method of claim 9, wherein providing the set of semiconductor structures defining the memory hole comprises:

forming a stack of alternating layers of nitride and oxide; and etching the stack of alternating layers of nitride and oxide to form the memory hole.

15. A method of forming a memory device, comprising:

providing a pair of semiconductor structures each having a sidewall defining a via, wherein the via has a first opening width along an upper portion of the sidewalls and a second opening width along a lower portion of the sidewalls, and wherein the first opening width is greater than the second opening width;

forming a blocking layer along the upper portion of the sidewalls of the pair of semiconductor structures by:

delivering a material at a first non-zero angle of inclination relative to a normal extending perpendicular from a top surface of the pair of semiconductor structures; and delivering the material at a second non-zero angle of inclination relative to the normal extending perpendicular from the top surface of the pair of semiconductor structures, wherein the blocking layer is prevented from being formed along the lower portion of the sidewalls of the pair of semiconductor structures, and wherein an opening through the blocking layer is present above the via; and etching, following formation of the blocking layer, the lower portion of the sidewalls of the pair of semiconductor structures to increase the second opening width.

16. The method of claim 15, wherein etching the lower portion of the sidewalls of the pair of semiconductor structures comprises performing a wet etch process while the blocking layer is present along the upper portion of the via.

17. The method of claim 16, further comprising performing an ion implant to the sidewalls of the pair of semiconductor structures while the blocking layer is present along the upper portion of the via, wherein the lower portion of the opening is etched following the ion implant.

18. The method of claim 17, wherein the performing the ion implant comprises directing argon ions into the lower portion of the via.

19. The method of claim 15, wherein delivering the material at the first and second non-zero angles comprises depositing carbon along a top surface of the pair of semiconductor structures and along the upper portion of the via.

20. The method of claim 15, wherein providing the pair of semiconductor structures comprises:

forming a stack of alternating layers of nitride and oxide; and etching the stack of alternating layers of nitride and oxide to form the via.

* * * * *